(12) United States Patent
Nielsen et al.

(10) Patent No.: US 8,075,298 B2
(45) Date of Patent: Dec. 13, 2011

(54) FLEXIBLE NANO-IMPRINT STAMP

(75) Inventors: Theodor Nielsen, Copenhagen (DK); Anders Kristensen, Copenhagen (DK); Ole Hansen, Hørsholm (DK)

(73) Assignee: Nil Technology APS, Kgs. Lynby (DK)

( * ) Notice: Subject to any disclaimer, the term of this patent is extended or adjusted under 35 U.S.C. 154(b) by 1155 days.

(21) Appl. No.: 11/574,645

(22) PCT Filed: Sep. 7, 2005

(86) PCT No.: PCT/DK2005/000570
§ 371 (c)(1),
(2), (4) Date: Aug. 14, 2007

(87) PCT Pub. No.: WO2006/026993
PCT Pub. Date: Mar. 16, 2006

(65) Prior Publication Data
US 2008/0000375 A1 Jan. 3, 2008

Related U.S. Application Data

(60) Provisional application No. 60/612,520, filed on Sep. 24, 2004.

(30) Foreign Application Priority Data

Sep. 8, 2004 (DK) .................................. 2004 01354

(51) Int. Cl.
*B29C 59/00* (2006.01)
(52) U.S. Cl. ........................................ 425/385; 264/293
(58) Field of Classification Search .................. 425/385; 264/293
See application file for complete search history.

(56) References Cited

U.S. PATENT DOCUMENTS

| | | | |
|---|---|---|---|
| 5,817,242 A * | 10/1998 | Biebuyck et al. | ............... 216/41 |
| 6,365,059 B1 | 4/2002 | Perchenik | |
| 6,743,368 B2 | 6/2004 | Lee | |
| 2002/0132482 A1 | 9/2002 | Chou | |
| 2003/0017424 A1 | 1/2003 | Park et al. | |
| 2005/0178280 A1* | 8/2005 | Lee et al. | ....................... 101/453 |

OTHER PUBLICATIONS

U. Plachetka et al., "Wafer scale patterning by soft UV-Nanoimprint Lithography", Microelectronic Engineering 73-74 (2004) 167-171.
Dahl-Young Khang et al., "Low-Pressure Nanoimprint Lithography", NANO Letters 2004, vol. 4, No. 4, pp. 633-637.

* cited by examiner

*Primary Examiner* — Maria Veronica Ewald
(74) *Attorney, Agent, or Firm* — Stephen A. Bent; Foley & Lardner LLP

(57) ABSTRACT

The present invention relates to a nano-imprinting stamp for imprinting nanometer-sized to mm-sized structures, the stamp (1) having a base part and a first and a second imprinting section (2,3), the first and second imprinting sections having a lithographic pattern (7) intended for imprinting in a receiving substrate. In a first aspect, the first and the second imprinting sections (2,3) are independently displaceable in a direction substantially parallel to an imprinting direction of the imprinting stamp. In a second aspect, the first and the second imprinting sections (2,3) are mechanically weakly coupled in a direction substantially parallel to an imprinting direction of the imprinting stamp. The stamp limits the effect of imperfections in or on the substrate to be imprinted with a lithographic pattern (7) and imperfections in or on the stamp and any combinations of such imperfections by localising the bending of the stamp to the base part (5) in-between the imprinting sections (2,3).

29 Claims, 7 Drawing Sheets

FLEXIBLE NANO-IMPRINT STAMP

FIELD OF THE INVENTION

The present invention relates to a nano-imprinting stamp for imprinting nanometer-sized to mm-sized structures, the stamp comprises a base part and a first and a second imprinting section, the first and second imprinting sections having a lithographic pattern intended for imprinting in a receiving substrate.

BACKGROUND OF THE INVENTION

The drive for miniaturisation to the submicron level within the field of electronics necessitates constant improvements in lithographic processing. Nano-imprint lithography (NIL) is a promising lithographic technique for producing nanometer-sized structures in a parallel process. NIL has been adapted on the International Technology Roadmap for Semiconductors (IRTS) as a potential lithographic technique in order to meet the target of a 32-nm node in 2013. However, a number of technical problems related to NIL have to be solved first, such as: homogeneity of large imprint areas, sub-micron alignment, error detection, cycle time, and critical dimension control.

In Microelectronic Eng. 73-74 (2004) p. 167-171, Plachetka et al. discloses a NIL process based on ultraviolet (UV) curable resists. In this UV-NIL process, a flexible transparent stamp fabricated of polydimethylsiloxane (PDMS) ensures a conform contact to the UV-curable resist coated on a substrate. Due to the elastomeric character of the PDMS the stamp adapts its shape to the waviness of the substrate and the lack of parallelism between the substrate and the stamp is solved in this way.

US2003/0017424 discloses a technique intended for forming patterns, such as grating structures on semiconductor substrates and other structures. Thus, this reference describes an imprint master (stamp) that may be rigid or mechanically flexible. For creation of the pattern the imprint master is pressed against a substrate coated with a deformable viscous or liquid material. The imprint master may be a composite member including a fixed medium (imprinting section) and a bulk material (back part). The fixed medium includes the imprint pattern and may be formed of a hard material, such as silicon, or it may be formed of a mechanically flexible material, such as PDMS. The bulk material may similarly be formed of a hard material, such as silicon or glass that may have been formed thin enough to be somewhat bendable, or it may be formed of a mechanically flexible material, such as PDMS.

However, a problem for stamps made of an elastomeric material is that during imprinting the stamp will be deformed in a direction perpendicular to the imprinting direction due to a relatively high Poisson's ratio of the stamp material. This may cause an undesirable stretching or distortion of the lithographic pattern of the stamp. Therefore, the applied pressure on the stamp of Plachetka et al. and the flexible stamps of US2003/0017424 are effectively limited to a low range of pressures. Moreover, relatively large but local imperfections in or on the substrate may influence neighbouring imprinting sections of such a stamp.

US 2002/0132482 discloses a method of imprint lithography using a fluid pressure to press a mould (stamp) into a substrate-supported film. The mould consists of a body and a moulding layer that are typically made of hard materials such as fused quarts, glass or ceramic. The substrate comprises a semiconductor wafer and the substrate-supported film can be a polymer such as PMMA or it can be a liquid, such as UV-curable silicone. The mould body and/or the substrate are made flexible by using silicon substrates with a thickness less than 2 mm. Thereby the mould and substrate will conform despite deviations from planarity. The pressure used during the imprinting process is within the range 1-1000 psi=6.9 kPa–6.9 MPa.

However, the stamps of US 2002/0132482 suffer from the inherent disadvantage that the bending of the mould/substrate the imprinting will inevitably result in an inhomogeneous imprinting pressure, which may in turn seriously deteriorate the formed lithographic pattern.

Hence, an improved stamp for NIL would be advantageous, and in particular a more flexible stamp would be advantageous.

SUMMARY OF THE INVENTION

Accordingly, the invention preferably seeks to mitigate, alleviate or eliminate one or more of the above-mentioned disadvantages singly or in any combination. In particular, it may be seen as an object of the invention to provide a flexible NIL stamp that may limit the effect of imperfections in or on the substrate to be imprinted with a lithographic pattern and/or imperfections in or on the stamp and any combinations of such imperfections.

This object and several other objects are obtained in a first aspect of the invention by providing a nano-imprinting stamp, comprising a base part and a first and a second imprinting section, the first and the second imprinting sections being independently displaceable in a direction substantially parallel to an imprinting direction of the imprinting stamp.

In a second aspect, the invention provides a nano-imprinting stamp, comprising a first and a second imprinting section being integrated with a base part, wherein the first and the second imprinting sections are mechanically weakly coupled in a direction substantially parallel to an imprinting direction of the imprinting stamp.

The invention according to the first and second aspect is particularly but not exclusively advantageous for obtaining a nano-imprinting lithographic stamp capable of limiting the effect of imperfections in or on the substrate to be imprinted with a lithographic pattern and/or imperfections in or on the stamp and any combinations of such imperfections. In particular, the present invention provides a stamp that may apply relatively high imprinting forces during imprinting while still limiting the effect of imperfections. Imperfections may comprise: curvature of substrate and/or polymer film on the substrate, curvature of the pressing tool for pressing the stamp against the substrate, entrapment of air between stamp and substrate, protrusions in the substrate to be imprinted, dust or similar unwanted particles at imprinting sites, isolated defects in the lithographic pattern, limited polymer flow of the polymer to be imprinted, insufficient anti-sticking coating on the stamp, etc.

The present invention is not limited to applications with only a single imprinting direction. Rather, the invention may in particular be used in applications with more than one imprinting direction, i.e. where the stamp has more than one imprinting direction for a multidimensional lithographic pattern. Alternatively or additionally, the lithographic pattern of the stamp may be intended for imprinting at a non-parallel orientation relative to a substrate plane.

The nano-imprinting stamp may have an effective bending stiffness of the first and second imprinting sections that is substantially larger than the effective bending stiffness of the base part in a direction substantially parallel to an imprinting direction of the imprinting stamp. Thus, the base part may function as a resilient part or a deflection-absorbing part relative to the imprinting sections.

Advantageously, a ratio ($r_s$) between the effective bending stiffness of the first and/or the second imprinting sections, and the effective bending stiffness of the base part in a direction substantially parallel to an imprinting direction of the imprinting stamp may have a minimum value chosen from the group of: 10, 20, 30, 40, 50, 60, 70, 80, 90 or 100. Therefore, the stamp is able to conform to a modulated surface while maintaining the effective bending stiffness of the imprinting sections and thereby enable a more uniform imprinting pressure. Effectively, any bending of the nano-imprinting stamp during imprinting is localised primarily or exclusively in the base part in-between or connecting the imprinting sections.

The nano-imprinting stamp may be so arranged that the first and second imprinting sections are independently displaceable in a direction substantially parallel to an imprinting direction of the imprinting stamp for elastic displacements of the first and/or the second imprinting sections.

The first and second imprinting sections of the nano-imprinting stamp may be independently displaceable in a direction substantially parallel to an imprinting direction of the imprinting stamp for displacements less than an average height of the lithographic pattern to be imprinted. Alternatively, the said displacements may be substantially equal to or larger than an average height of the lithographic pattern to be imprinted.

The nano-imprinting stamp may have the first and the second imprinting sections independently displaceable in a direction substantially parallel to an imprinting direction of the imprinting stamp for displacements substantially equal to or smaller than a thickness variation of a substrate to be imprinted. Typically, a polished substrate of silicon may have a thickness variation across the wafer of 5 micrometer. Due to the independency of the imprinting sections the thickness variation may be compensated by the present invention.

For the nano-imprinting stamp, the first and the second imprinting sections may be independently displaceable in a direction substantially parallel to an imprinting direction of the imprinting stamp for displacements in the range from 1 nm to 10 micrometer, preferably 5 to 500 nm, more preferably 10 to 100 nm, of the first and/or the second imprinting sections.

For the nano-imprinting stamp of the present invention the first and the second imprinting sections may be substantially relatively fixated in a direction substantially perpendicular to an imprinting direction of the imprinting stamp. Thus, displacements perpendicular to an imprinting direction of the imprinting stamp may be almost completely eliminated with an improved imprinting as a consequence.

The nano-imprinting stamp may be so dimensioned that the base part comprises a membrane, the membrane connecting the first and second imprinting sections. Thus, imperfections during imprinting may be absorbed by the membrane. Beneficially, the first and/or second imprinting sections may have a thickness larger than the thickness of the membrane in a direction substantially parallel to an imprinting direction of the imprinting stamp. Specifically, the ratio ($r_t$) between the thickness of the at least one imprinting section, and the thickness of the membrane may have a minimum value chosen from the group of: 1.5, 2, 2.5, 3, 3.5, 4, 4.5, 5, 5.5, 6, 6.5, 7, 8, 9, or 10.

The nano-imprinting stamp may be so arranged that the first and the second imprinting sections comprise a first portion with a lithographic pattern, a second portion forming part of the membrane, and a third portion. Beneficially, at least the third portion is encapsulated in a resilient back matrix, i.e. said back matrix may comprise an elastomeric polymer, a gel, a confined fluid, gas or similar. The effect of the resilient back matrix may be to evenly distribute the imprinting force during imprinting.

Typically, the nano-imprinting stamp may be manufactured by microelectronic processing means well-known to the skilled person. Beneficially, the processing may be done in a semiconductor material, preferably Si, Ge or C and any combinations thereof and any structural modifications thereof. Beneficially, the nano-imprinting stamp may be manufactured primarily or solely in a material having a Young modulus of at least 1 GPa, preferably at least 10 GPa, or more preferably at least 100 GPa. Thus, the stamp may preferably be manufactured in a sufficiently rigid and non-elastomeric material.

The nano-imprinting stamp may comprise sensing means so that the displacement in a direction substantially parallel to an imprinting direction of the imprinting stamp for at least one of the first and the second imprinting sections is detectable by said sensing means. Thus, the position of any displacement may be located resulting in a more efficient manufacturing process.

In a third aspect, the invention provides a method for imprinting a lithographic pattern in a receiving substrate utilising a nano-imprinting stamp according to the first or the second aspect.

The invention according to the third aspect is particularly but not exclusively advantageous for providing a method that gives a more uniform imprinting compared to the methods hitherto known. In particular, the high requirements of the parallelism between the substrate to be imprinted and the imprinting stamp are reduced by applying the present invention. Typically, the pressure during imprinting may have an approximate minimum value chosen from the group of: 10 kPa, 50 kPa, 100 kPa, 250 kPa, or 300 kPa. However, the method is not limited to these minimum values, and may find application in both lower and higher pressure regimes.

The method of the invention may be applied so that the imprinting stamp is pressed against the receiving substrate by a parallel plate apparatus. Alternatively, the imprinting stamp may be pressed against the receiving substrate by an air-cushion apparatus.

Typically, the receiving substrate has an inwardly or outwardly bent curvature depending on the manufacturing, stress condition and temperature.

The first, second and third aspects of the present invention may each be combined with any of the other aspects. These and other aspects of the invention will be apparent from and elucidated with reference to the embodiments described hereinafter.

BRIEF DESCRIPTION OF THE FIGURES

The present invention will now be explained, by way of example only, with reference to the accompanying Figures, where.

DETAILED DESCRIPTION OF THE INVENTION

Figure 1:
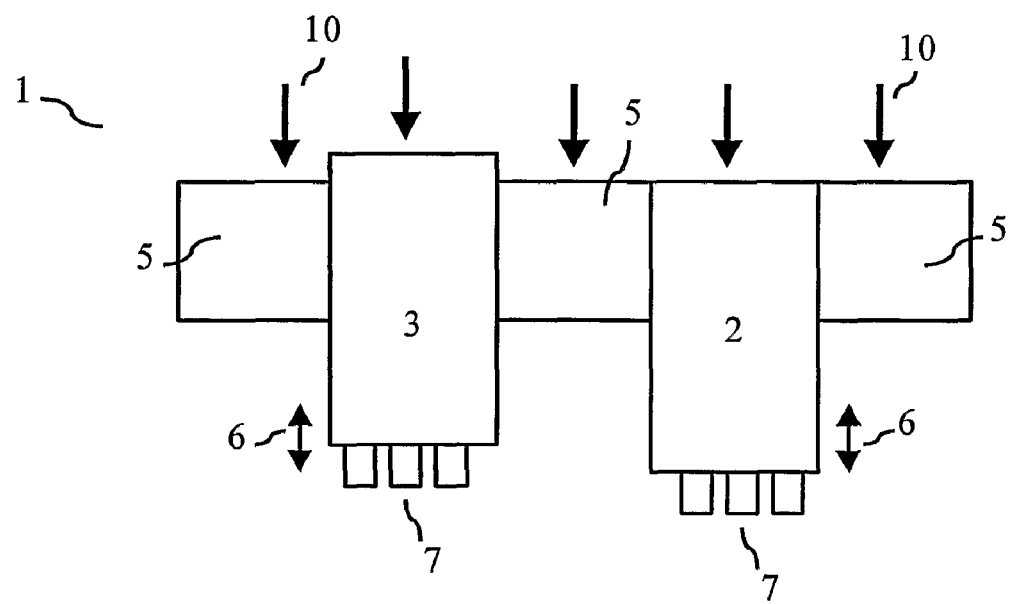
FIG. 1 shows a cross-sectional view of a first embodiment of the invention.
Figure 2:
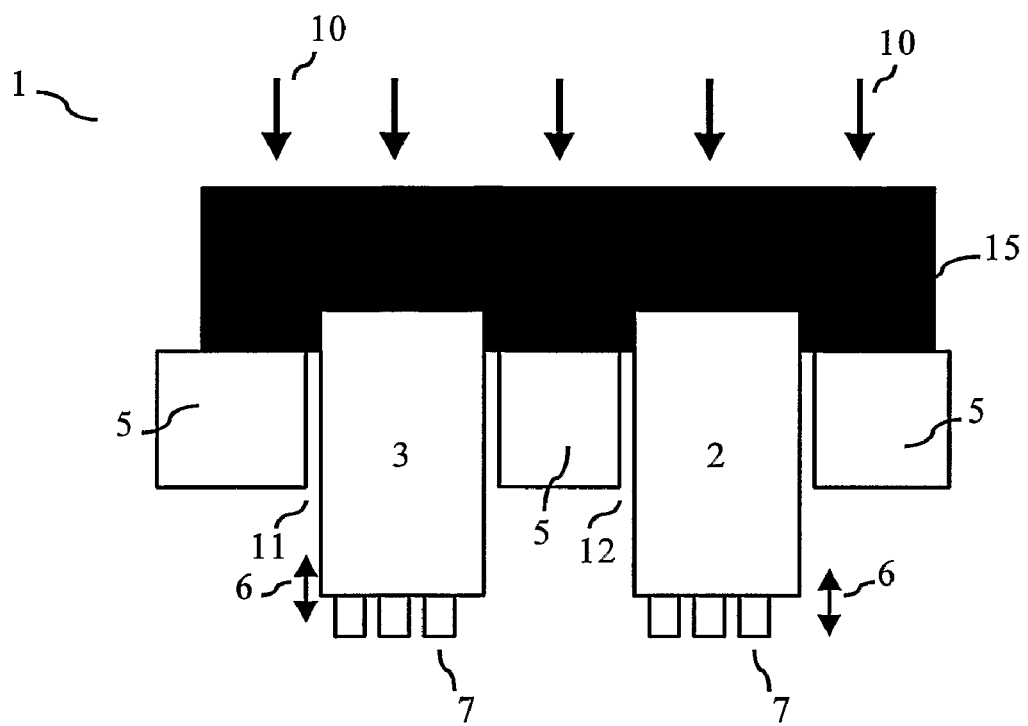
FIG. 2 shows a cross-sectional view of a second embodiment of the invention.
Figure 3:
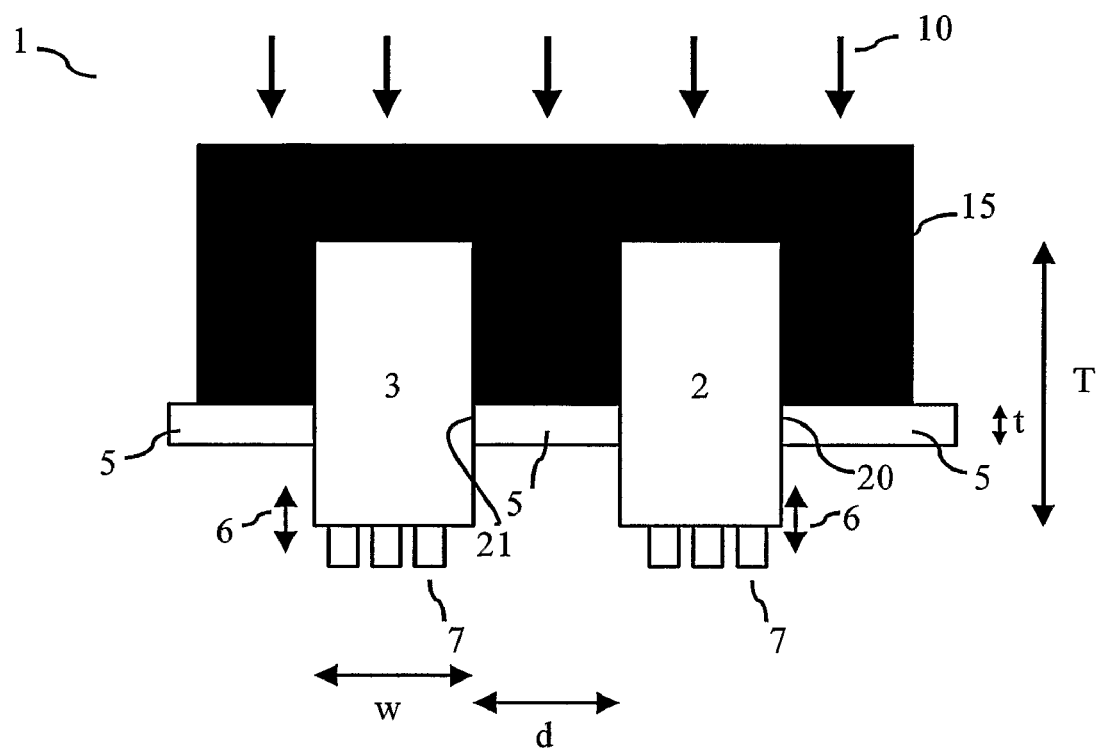
FIG. 3 shows a cross-sectional view of a third embodiment of the invention.

FIG. 1 shows a cross-sectional view of a first embodiment of a nano-imprinting stamp 1 according to the invention. The stamp 1 comprises a first imprinting section 2 and a second imprinting section 3. For reasons of clarity only two imprinting sections 1 and 2 are shown in FIGS. 1 to 3. In the embodiment of FIG. 1, the first and second imprinting sections 2 and 3 are mounted in a base part 5 having appropriate holes for receiving the first and second imprinting sections 2 and 3. The first and second imprinting sections 2 and 3 are mounted in the base part 5 so as to enable that an imprinting force, indicated by the arrows 10, may displace the entire stamp 1 downwards as shown in FIG. 1, while the first and second imprinting sections 2 and 3 are independently displaceable in a vertical direction as indicated by the double-headed arrows 6. This is realised by providing an appropriate friction force at the interfaces between the first and second imprinting sections 2 and 3 and the base part 5. Thus, as the stamp 1 is pressed vertically downwards, as shown in FIG. 1, against a substrate to be imprinted (not shown in FIG. 1), each of the imprinting sections 2 and 3 may be slightly displaced upwards if some kind of imperfection is encountered, e.g. a bend or protrusion of the substrate. In FIG. 1, this is shown by a small upward displacement of the second imprinting section 3 relative to the first imprinting section 2. The upward displacement of the second imprinting section 3 can be controlled by variation of the friction forces in the interface between the base part 5 and the imprinting sections 2 and 3. The said friction forces should be of a sufficient magnitude relative to the imprinting force 10 so as to allow imprinting to take place. The first and second imprinting sections 2 and 3 comprise a lithographic pattern 7 to be imprinted on a substrate.

FIG. 2 shows a cross-sectional view of a second embodiment of the nano-imprinting stamp 1 according to the invention. In the embodiment of FIG. 2, the imprinting sections 2 and 3 are received in the corresponding holes 11 and 12 of the base part 5, but there is no direct physical contact between the imprinting sections 2 and 3 and the base part 5. Instead, the upper parts of the imprinting sections 2 and 3 are embedded in a back matrix 15 of an elastomeric material such as PDMS or similar. The back matrix 15 serves the dual purpose of providing a way of transmitting the imprinting force 10 to the imprinting sections 2 and 3 and allowing for the imprinting sections 2 and 3 to be independently displaceable in an imprinting direction of the imprinting stamp 1 as indicated by the arrows 6. The base part 5 serves the purpose of constraining the imprinting sections 2 and 3 in a direction perpendicular to an imprinting direction of the imprinting stamp 1 due to the transversal deformation of the back matrix 15 under high values of the imprinting force 10. Thus, under high values of the imprinting force 10, the base part 5 can come into physical contact with the imprinting sections 2 and 3. The clearance between the base part 5 and the imprinting sections 2 and 3 may be minimised so as to limit any displacement of the imprinting sections 2 and 3 in a direction perpendicular to an imprinting direction of the imprinting stamp 1.

FIG. 3 shows a cross-sectional view of a third embodiment of the nano-imprinting stamp 1 according to the invention. In the embodiment shown in FIG. 3, the imprinting sections 2 and 3 are integrated with the base part 5. Thus, at the interfaces 20 and 21 between the first and second imprinting sections 2 and 3 and the base part 5, the first and second imprinting sections 2 and 3 are either bonded, e.g. by adhesive bonding, anodic bonding, fusion bonding, etc., to the base part 5, or alternatively the base part 5 and imprinting sections 2 and 3 can be manufactured in a single piece of material, e.g. a semiconductor material like Si or similar. In this embodiment, the ability of the first and second imprinting sections 2 and 3 to be independently displaceable in a direction substantially parallel to an imprinting direction of the imprinting stamp 1 is assured by an appropriate design of the magnitude of the thickness t of the base part 5 relative to the thickness T of the imprinting sections 2 and 3 as it is explained in more detail below. Also the width W of the imprinting sections 2 and 3 relative to the separation distance d of the imprinting sections 2 and 3 should be taken into consideration. The thickness T should be substantially larger than the thickness t so that the thin base part 5 bends locally upwards around an imprinting section 2 or 3 that is displaced relatively upwards due to some kind of imperfection during the imprinting process. Thus, the base part 5 has a membrane-like structure and function. Also in this embodiment the back matrix 15 is made of an elastomeric material, e.g. PDMS, which makes it possible to apply a homogeneous imprint force 10 to the stamp 1. Secondly, the back matrix 15 can be resiliently compressed if any of the imprinting sections 2 and 3 are displaced relatively upwards during imprinting. The back matrix 15 can also provide support in keeping the imprinting sections 2 and 3 parallel to one another during the imprinting process.

In any of the above-described embodiments, the imprinting stamp 1 can be applied in a so-called thermal nano-imprinting lithographic (NIL) process, in which the substrate to be imprinted comprises a polymer such as PMMA, the polymer being heated above the glass transition temperature. Subsequently, the stamp 1 is pressed into the polymer and the form is replicated into the polymer. Subsequently, a cooling process starts. As the cooling causes the temperature of the polymer to fall below the glass transition temperature the imprinting pressure is released, and eventually the stamp 1 is released from the polymer (see further details below). For such a thermal NIL, also named hot-embossing, the base part 5 and the imprinting sections 2 and 3 can be manufactured in a single piece of crystalline semiconductor material such as Si by well-known micro-electronic processing to be described below.

In any of the three embodiments above, the imprinting stamp 1 can also be applied in a so-called UV nano-imprinting lithographic (NIL) process, in which the substrate to be imprinted comprises a top layer of an UV-curable polymer such as LR8765 (BASF AG). The base part 5 and the imprinting sections 2 and 3 should accordingly be manufactured in an appropriate light-transparent material in order to facilitate lithographic patterning by means of light-curable materials. Examples of appropriate transparent materials are glass, quartz (single crystal or fused), diamond, polymers like SU-8 etc. Alternatively or additionally, the underlying substrate may be manufactured in a transparent material.

It should be noted that the present invention has the advantage that the damages inflicted by any imperfections are in general limited to isolated sites on the lithographic pattern to be imprinted due to the independency of the imprinting sections 2 and 3. One or more imprinting sections 2 and 3 may be connected to appropriate sensors (not shown in the Figures) capable of detecting whether or not any displacement of the imprinting sections 2 and 3 has taken place, and possibly the sensors may detect the magnitude of the displacements. Thus, an array of integrated error detection sensors can be mounted on or integrated with the stamp 1. The sensors may be of the atomic force microscopy (AFM) type on the rear side of the imprinting sections 2 and 3. Alternatively, piezoelectricity or capacitative variation may be exploited to transform a displacement into electric signals indicative of the displacement. The piezoelectric sensor may advantageously be integrated with the base part 5, especially for a silicon base part 5. Light beam scanning can also be used in connection with an optically transparent back matrix 15 or an optically active back matrix 15 capable of changing one or more optical properties due to a displacement of an imprinting section 2 or 3. The possibility to locate and even quantize the displacement of an imprinting section 2 or 3 is quite beneficial due to the fact that a lithographic patterning process is typically just one out of many additional manufacturing steps for a micrometer or nanometer scaled device. Thus, the detection of an error during the imprinting step can render superfluous further manufacturing steps at the site of the localised error resulting in a more efficient production.

In the following part of the description is disclosed an example of how a nano-imprinting stamp 1 according the third embodiment (shown in FIG. 3) can be manufactured and applied.

Figure 4:
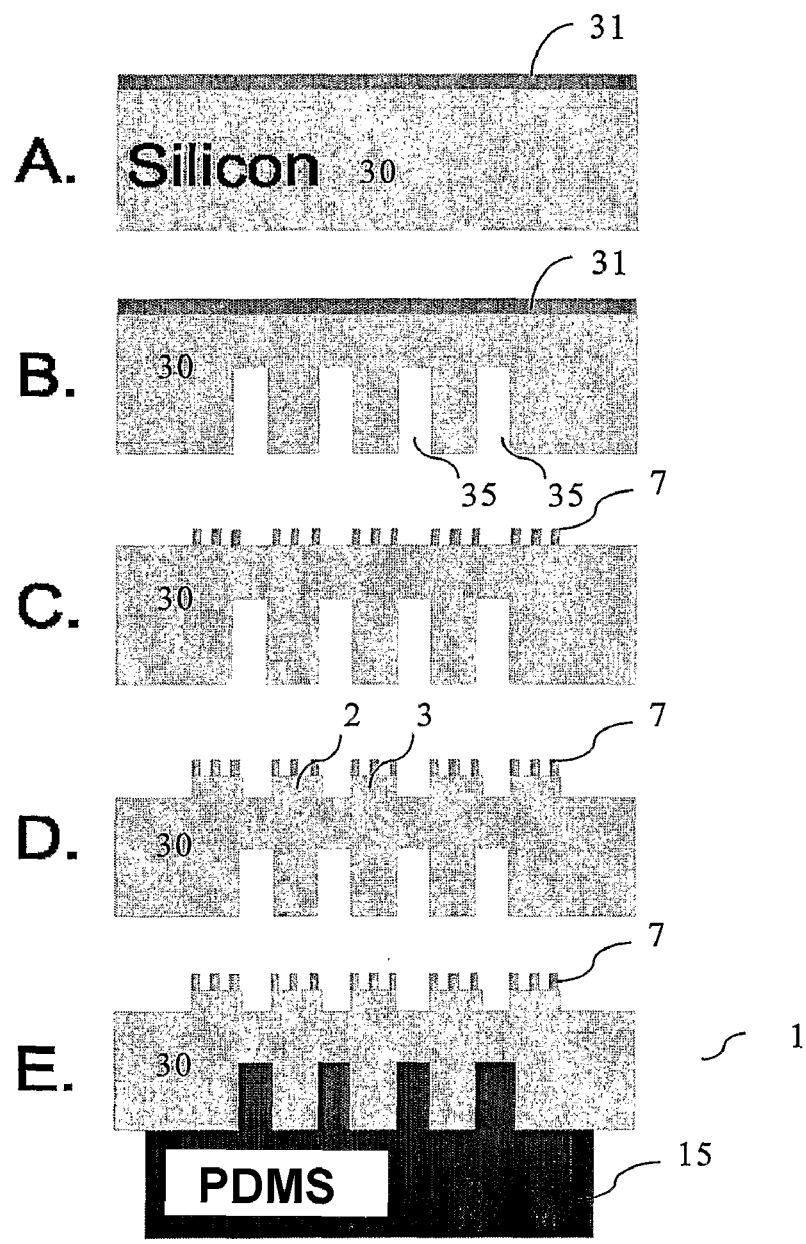
FIG. 4 illustrates the fabrication sequence for a stamp according to the invention.

FIG. 4 illustrates the fabrication sequence for a stamp 1 according to the third embodiment of the invention intended for thermal NIL. The stamp 1 is manufactured in a single side polished silicon wafer 30. An oxide 31 is grown on both sides of the silicon wafer 30, and the oxide layer on the back side is removed by buffered hydrofluoric acid (BHF) etching. The resulting wafer 30 is shown in FIG. 4, part A.

Subsequently, a 1.5-micrometer photoresist (AZ521e, Shipley) is spin-coated onto the back side and developed in negative process (UV-lithography) for defining the imprinting sections 2 and 3. 300 nm of aluminium is e-beam evaporated (Alcatel SCM600) on the back side and lifting off is done by acetone and ultrasonic treatment. The remaining aluminium is used as an etch mask for a deep reactive ion etching (STS ASE) creating holes 35 in the resulting wafer 30 as shown in FIG. 4, part B.

The front side with the silicon oxide 31 is then coated with a 1.5-micrometer photoresist (AZ521e, Shipley). The photoresist is developed through a mask, where the lithographic patterns 7 should be positioned under the mask. The lithographic patterns 7 are etched into the silicon dioxide layer 31 by a BHF etch using the silicon as a stop layer. Any kind of lithographic pattern 7 may be applied as the present invention is not limited to a specific lithographic pattern 7. Rather it is contemplated that the present invention may find application in a broad range of electronic and micro-mechanical applications such as optoelectronics, nano-electronics, micro-electro-mechanical-systems (MEMS), etc. The resulting wafer 30 is shown in FIG. 4, part C.

Using another photoresist process to cover the lithographic patterns 7 as an etch mask, a subsequent reactive ion etching (RIE) is applied to etch 1.7 micrometer into the silicon from the front side resulting in a wafer 31 as shown in FIG. 4, part D, where imprinting sections 2 and 3 are defined by a mesa structure. This mesa structure may have any width but some preferred widths are 0.5 cm, 1 cm, 1.5 cm, 2 cm, 2.5 cm or 3 cm.

Finally, the back of the wafer 31 is embedded within a back matrix 15 of PDMS (Sylgaard 184) and a stamp 1 similar to the stamp shown in FIG. 3 is obtained as shown in FIG. 4, part E.

In a particular embodiment, the specific dimensions of the stamp 1 are as given in Table 1 together with an indication of possible intervals:

TABLE 1

| Parameter | Particular embodiment (micrometer) | Possible interval (micrometer) |
|---|---|---|
| Membrane thickness t | 150 | 10-500 |
| Imprinting section thickness T | 550 | 20 up to wafer thickness |
| Imprinting section width W | 1000 | 10 up to wafer width |
| Imprinting section distance d | 500 | 0-10000 |

With the specific dimensions given in Table 1 and using the mechanical constants of crystalline silicon, a simplified spring model yields a resulting effective spring constant for the imprinting sections 2 and 3 of $1.85 \times 10^7$ N/m. Thus, with this effective spring constant any deformation of the stamp 1 due to e.g. waviness of the substrate to be imprinted is isolated to the surrounding portion of the base part 5 for relevant imprinting forces and conditions, such as an imprinting force between 0 to 40 kN, preferably from 1 kN to 10 kN.

Similarly, the effective spring constant for the imprinting sections 2 and 3 can be in the range from 1 to $1 \times 10^9$ N/m, preferably in the range from $1 \times 10^4$ to $1 \times 10^7$ N/m, depending on the imprinting conditions.

A simple model of the stamp to substrate conformation may be obtained by considering the pressure, p, needed to conform a modulated surface to a perfect opposing plane. The pressure may be found from the plate deflection equation, see L. D. Landau and E. M. Lifshitz, Theory of Elasticity, (1986);

$$\nabla^2 \nabla^2 w(r) = p(r)/D \qquad (1)$$

w(r) is the deflection normal to the surface, r is the position vector, and D is the flexural rigidity given by $$D = Eh^3/[12(1-\nu^2)], \qquad (2)$$

where E is the Young modulus, h is the thickness, $\nu$ is the Poisson's ratio of the plate. Experiments performed by the inventors show that the deflection normal to the surface, i.e. the surface modulation, may be approximated by the first term of a Bessel series, i.e.

$$w(r) = a\, J_0(kr), \qquad (3)$$

a being a scaling constant. Thus, under the assumption of cylindrical symmetry, the pressure, p, may be given by $$p = D\, k^4\, w = 4\pi^4 E\, h^3 w(r)/[3\lambda^4(1-\nu^2)], \qquad (4)$$

where $\lambda$ is a dominant wavelength of the surface modulation. It is noted that the pressure required to flattening out the modulated surface scales with the thickness of the surface to the third, $h^3$, and scales inversely with the waviness of the surface to the fourth, $\lambda^{-4}$. It may be noted that this scaling of the thickness of the surface to the third, $h^3$, will also follow from a simple spring model mentioned above considering the imprinting sections 2 and 3 to be clamped-clamped beams.

For a realistic imprinting situation both the substrate to be imprinted on (see FIG. 5, reference 106) and the stamp 1 will have a certain waviness of the surface, and hence using equation (4) to estimate the pressure to make the stamp 1 and substrate to conform to one another is only an approximation. Nevertheless, an estimate of the pressure, p, may be obtained using w=5 µm, $\lambda$=4 cm, and the material constants for silicon. With h corresponding to the thickness T of the imprinting section 2 and 3; h=550 µm, the pressure, p, is 7.4 kPa, whereas for h=150 µm as for h corresponding to the thickness t of the membrane 5, the pressure, p, is only 0.13 kPa. For e.g. a total imprinting pressure of 255 kPa, the relative pressure variation for the membrane 5 is only 0.1% but for the imprinting sections 2 and 3 the relative pressure variation is as high as 5.8%. Thus, for the stamp 1 the compromise between the need for stamp-to-substrate conformation and minimum stamp bending is solved by localizing the stamp bending to uncritical regions, i.e. to the membrane or base part 5, while maintaining a high stiffness or effective spring constant in the critical regions of the stamp 1, i.e. the imprinting sections 2 and 3. Thus, the stamp 1 allows for simultaneous conformation to the substrate to imprint on and control of the imprinting sections 2 and 3.

Figure 5:
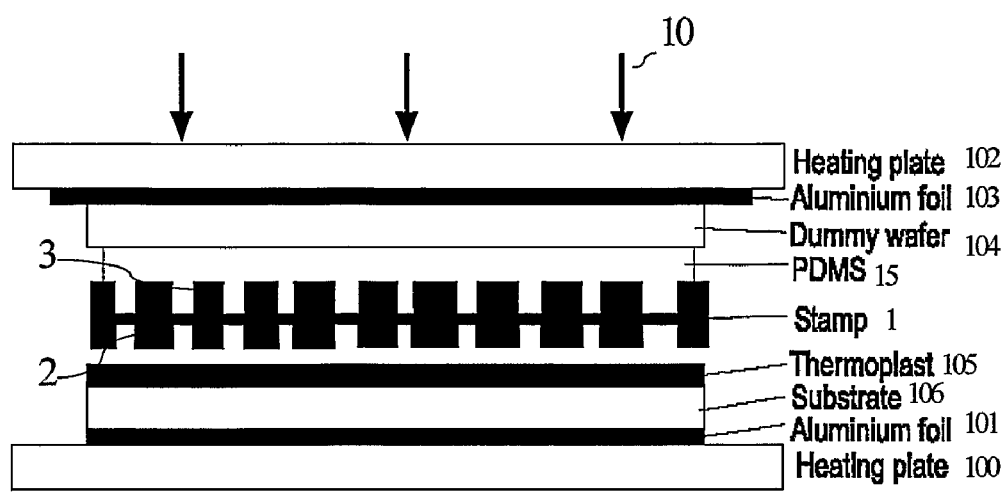
FIG. 5 illustrates the stacking of the stamp according to the invention with a substrate inside an imprinting tool.

FIG. 5 illustrates the stacking of the stamp 1 according to the embodiment of the invention with a substrate inside an imprinting tool of the parallel plate type. The stamp 1 is fixed via the back matrix 15 of PDMS on a dummy wafer 104. The dummy wafer 104 is mounted on an aluminium foil 103 for optimum heat conduction through an upper heating plate 102. The heating plate 102 is capable of being pressed down by pressing means (not shown) and thereby initiating the imprinting. Initially, the thermoplast 105 is heated above the glass transition temperature, i.e. for PMMA the imprinting temperature is 170° C. The imprinting force 10 is 2000 N and the imprinting lasts 5 min. with a chamber pressure of 0.1 mbar. The thermoplast 105 on the substrate 106 is fixed to an aluminium foil 101 and, in turn, to a heating plate 100 similar to the upper heating plate 102. The imprinting force 10 is released after 5 min. or when the temperature reaches 70° C. Cooling starts by flushing liquid nitrogen through dedicated channels (not shown) in the heating plates 100 and 102.

Alternative to a parallel plate apparatus, the stamp 1 according to the invention has been applied in a so-called air-cushion apparatus. Results from air-cushion experiments did not differ significantly from the results obtained with a parallel plate apparatus. In an air-cushion apparatus, the imprinting force originates from a high air pressure acting on the stamp 1 and therefore a homogeneous imprinting force is obtained. Additional details on air-cushion imprinting may be found in WO 03/090985. However, this method can also benefit from the present invention as the air-cushion method does not solve problems with curvature of substrate/polymer film on the substrate, curvature of the pressing tool for pressing the stamp against the substrate, entrapment of air between stamp and substrate, protrusions in the substrate to be imprinted, dust or similar unwanted particles at imprinting sites, etc. These problems may, however, be eliminated or minimised with the present invention.

Figure 6:
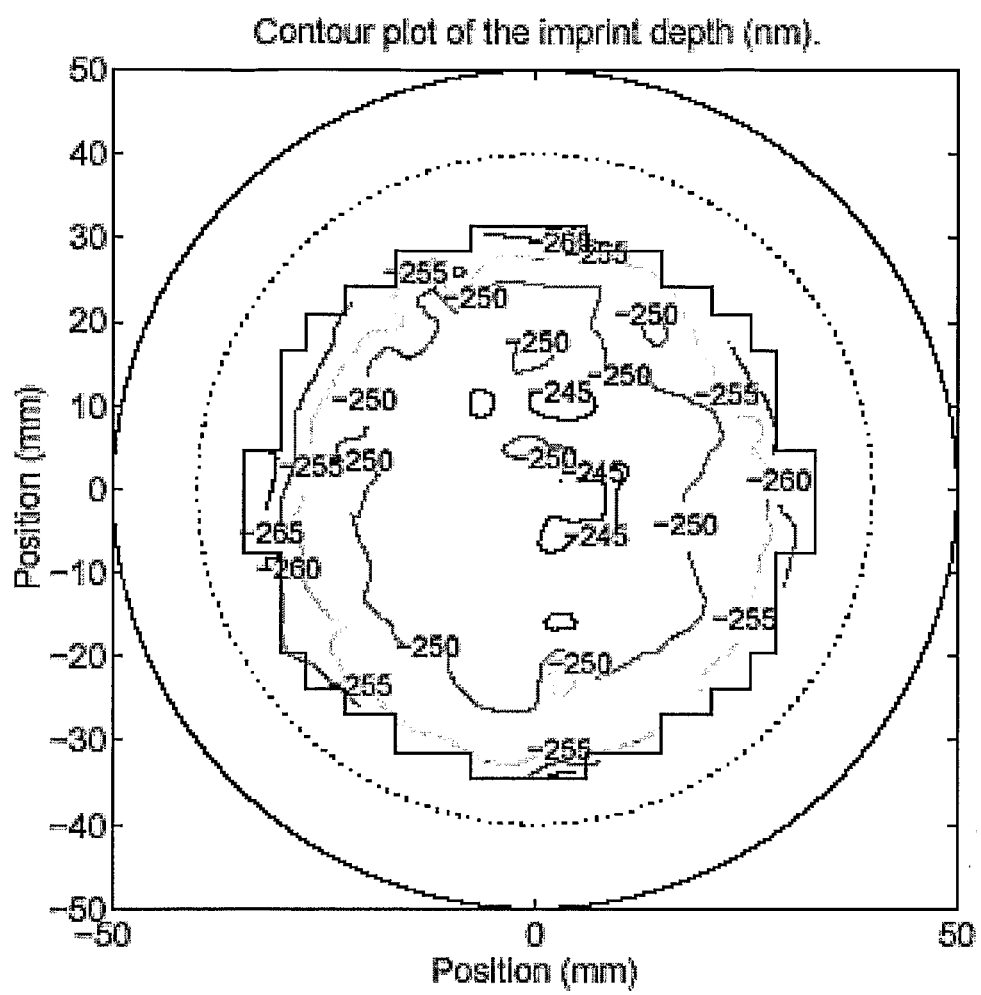
FIG. 6 shows a contour plot of the resulting imprint depth of a PMMA polymer layer on a Si wafer.

FIG. 6 shows a map of the measured imprint depths on a silicon wafer coated with a 307 nm thick (variation of 14.7 nm (3σ)) PMMA layer by applying a stamp 1 according to the third embodiment of the invention in a parallel plate apparatus. The imprint consists of 1562 imprint areas, each being 1 mm×1 mm, and each imprint area consists of a pattern of 8 lines being 1 mm long and 25 μm wide. The imprint depth is found to be 249.4 nm with a variation of 4.8 nm (3σ).

Figure 7:
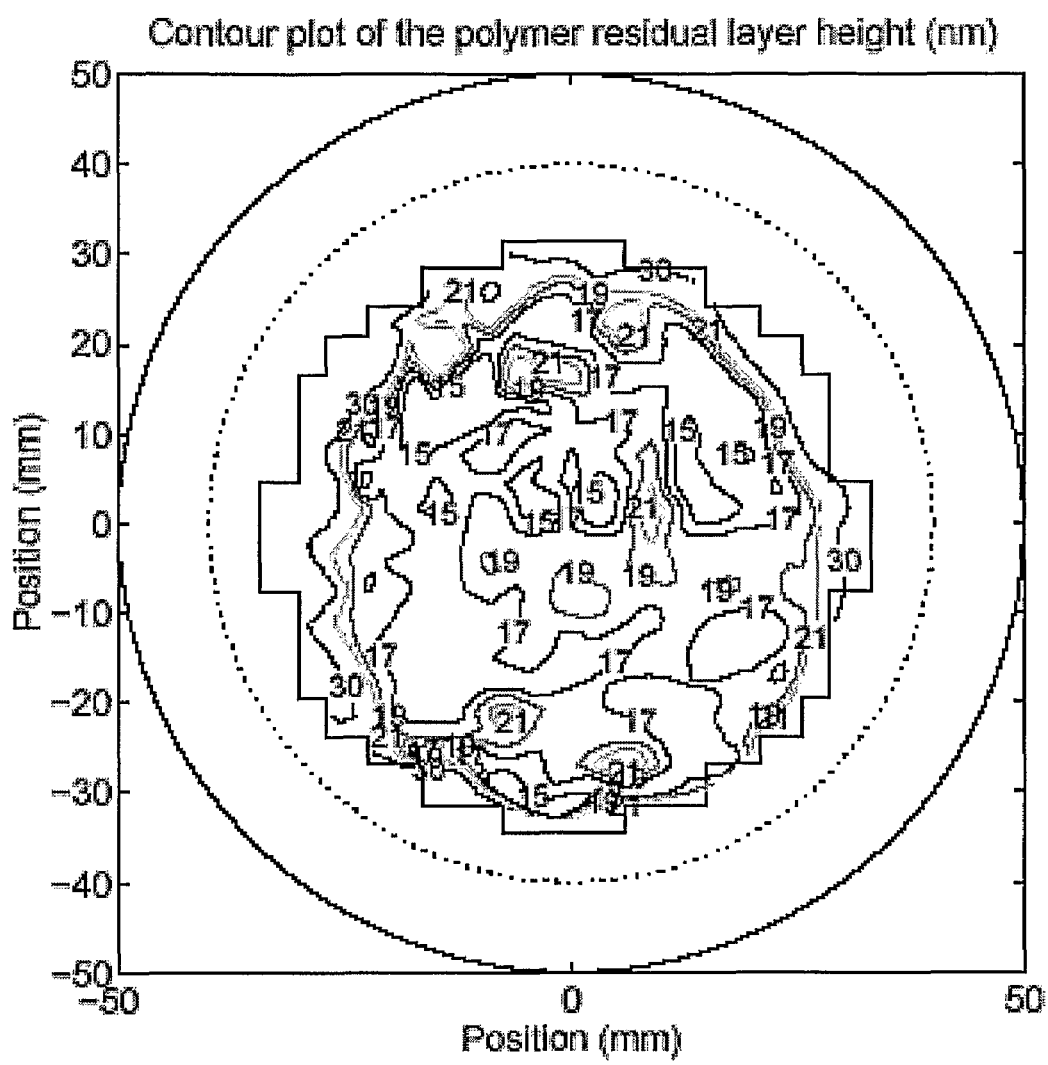
FIG. 7 shows a contour plot of the PMMA polymer residual height layer of FIG. 6.

FIG. 7 shows a map of the measured polymer residual thickness, e.g. the polymer thickness below the places where the stamp protrusions have imprinted. The polymer residual layer thickness is found to be 17.6 nm with a variation of 13.6 nm (3σ).

The results shown in FIGS. 6 and 7 demonstrate that imprinting with a stamp 1 according to the invention provides homogeneous imprinting over a large area. Furthermore, as shown in FIG. 7, a very low residual polymer layer with an acceptable variation is obtained. A low residual polymer layer is a key parameter for further processing of devices on the nanometer scale.

Although the present invention has been described in connection with the specified embodiments, it is not intended to be limited to the specific form set forth herein. Rather, the scope of the present invention is limited only by the accompanying claims. In the claims, the term comprising does not exclude the presence of other elements or steps. Additionally, although individual features may be included in different claims, these may possibly be advantageously combined, and the inclusion in different claims does not imply that a combination of features is not feasible and/or advantageous. In addition, singular references do not exclude a plurality. Thus, references to "a", "an", "first", "second" etc. do not preclude a plurality. Furthermore, reference signs in the claims shall not be construed as limiting the scope.

The invention claimed is:

1. A nano-imprinting stamp, comprising a first and a second imprinting section being integrated with a base part, wherein the first and the second imprinting sections are mechanically weakly coupled in a direction substantially parallel to an imprinting direction of the imprinting stamp, wherein the effective bending stiffness of the first and the second imprinting sections is substantially larger than the effective bending stiffness of the base part in a direction substantially parallel to an imprinting direction of the imprinting stamp, wherein the base part comprises a membrane that connects the first and the second imprinting sections.

2. A nano-imprinting stamp according to claim 1, wherein a ratio ($r_s$) between the effective bending stiffness of the first and/or the second imprinting sections, and the effective bending stiffness of the base part in a direction substantially parallel to an imprinting direction of the imprinting stamp, has a minimum value chosen from the group of: 10, 20, 30, 40, 50, 60, 70, 80, 90 or 100.

3. A nano-imprinting stamp according to claim 1, wherein the first and the second imprinting sections are independently displaceable in a direction substantially parallel to an imprinting direction of the imprinting stamp for elastic displacements of the first and/or the second imprinting sections.

4. A nano-imprinting stamp according to claim 1, wherein the first and the second imprinting sections are independently displaceable in a direction substantially parallel to an imprinting direction of the imprinting stamp for displacements less than an average height of the lithographic pattern to be imprinted.

5. A nano-imprinting stamp according to claim 1, wherein the first and the second imprinting sections are independently displaceable in a direction substantially paralell to an imprinting direction of the imprinting stamp for displacements substantially equal to or larger than an average height of the lithographic pattern to be imprinted.

6. A nano-imprinting stamp according to claim 1, wherein the first and the second imprinting sections are independently displaceable in a direction substantially parallel to an imprinting direction of the imprinting stamp for displacements substantially equal to or smaller than a thickness variation of a substrate to be imprinted.

7. A nano-imprinting stamp according to claim 1, wherein the first and the second imprinting sections are independently displaceable in a direction substantially parallel to an imprinting direction of the imprinting stamp for displacements in the range from 1 nm to 10 micrometer, preferably 5 to 500 nm, more preferably 10 to 100 nm, of the first and/or the second imprinting sections.

8. A nano-imprinting stamp according to claim 1, wherein bending of the nano-imprinting stamp during imprinting is localised primarily in the base part.

9. A nano-imprinting stamp according to claim 1, wherein the first and the second imprinting sections are substantially relatively fixated in a direction substantially perpendicular to an imprinting direction of the imprinting stamp.

10. A nano-imprinting stamp according to claim 1, wherein at least one of the first and the second imprinting sections has a thickness (T) larger than a thickness (t) of the membrane in a direction substantially parallel to an imprinting direction of the imprinting stamp.

11. A nano-imprinting stamp according to claim 9, wherein the ratio ($r_t$) between the thickness (T) of the at least one imprinting section, and the thickness (t) of the membrane has a minimum value chosen from the group of: 1.5, 2, 2.5,3,3.5, 4,4.5, 5,5.5, 6, 6.5, 7, 8, 9, or 10.

12. A nano-imprinting stamp according to claim 1, wherein the first and the second imprinting sections comprise a first portion with a lithographic pattern.

13. A nano-imprinting stamp according to claim 12, wherein the lithographic pattern is positioned on a mesa structure.

14. A nano-imprinting stamp according to claim 1, wherein the first and the second imprinting sections comprise a second portion forming part of the membrane.

15. A nano-imprinting stamp according to claim 14, wherein the second portion is manufactured as an integrated part of the membrane.

16. A nano-imprinting stamp according to claim 1, wherein the first and the second imprinting sections comprise a third portion.

17. A nano-imprinting stamp according to claim 16, wherein the third portion is protruding away from the membrane in a direction opposite to the imprinting direction.

18. A nano-imprinting stamp according to claim 16, wherein at least the third portion is encapsulated in a resilient back matrix.

19. A nano-imprinting stamp according to claim 18, wherein the resilient back matrix comprises an elastomeric polymer.

20. A nano-imprinting stamp according to claim 18, wherein the resilient back matrix comprises a confined fluid.

21. A nano-imprinting stamp according to claim 1 comprising sensing means, said sensing means being capable of detecting a displacement of at least one of the first and the second imprinting sections in a direction substantially parallel to an imprinting direction of the imprinting stamp.

22. A nano-imprinting stamp according to claim 1 being manufactured by microelectronic processing means.

23. A nano-imprinting stamp according to claim 1 being manufactured primarily from a material having a Young modulus of at least 1 GPa, preferably at least 10 GPa, or more preferably at least 100 GPa.

24. A nano-imprinting stamp according to claim 22, wherein the imprinting stamp comprises a semiconductor material.

25. A method for imprinting a lithographic pattern in a receiving substrate utilising a nano-imprinting stamp comprising a first and a second imprinting section being integrated with a base part, wherein the first and the second imprinting sections are mechanically weakly coupled in a direction substantially parallel to an imprinting direction of the imprinting stamp, wherein the effective bending stiffness of the first and the second imprinting sections is substantially larger than the effective bending stiffness of the base part in a direction substantially parallel to an imprinting direction of the imprinting stamp, wherein the base part comprises a membrane that connects the first and the second imprinting sections.

26. A method for imprinting a lithographic pattern in a receiving substrate according to claim 25, wherein the pressure during imprinting has an approximate minimum value chosen from the group of: 10 kPa, 50 kPa, 100 kPa, 250 kPa, or 300 kPa.

27. A method according to claim 25, wherein the imprinting stamp is pressed against the receiving substrate by a parallel plate apparatus.

28. A method according to claim 25, wherein the imprinting stamp is pressed against the receiving substrate by an air-cushion apparatus.

29. A method according to claim 25, wherein the receiving substrate has an inwardly or outwardly bent curvature.

* * * * *